United States Patent
Matsumoto

(10) Patent No.: US 6,682,958 B2
(45) Date of Patent: Jan. 27, 2004

(54) METHOD FOR MANUFACTURING SEMICONDUCTOR DEVICE BY USING SEALING APPARATUS

(75) Inventor: Jiro Matsumoto, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 90 days.

(21) Appl. No.: 10/103,889

(22) Filed: Mar. 25, 2002

(65) Prior Publication Data

US 2002/0140114 A1 Oct. 3, 2002

(30) Foreign Application Priority Data

Mar. 27, 2001 (JP) .......................................... 2001-089851

(51) Int. Cl.[7] .......................... H01L 21/44; H01L 21/48; H01L 21/50
(52) U.S. Cl. ........................................ 438/127; 425/544
(58) Field of Search ........................... 438/127; 425/544

(56) References Cited

U.S. PATENT DOCUMENTS

| | | | | |
|---|---|---|---|---|
| 5,125,821 A | * | 6/1992 | Saeki et al. ................. | 425/170 |
| 5,834,035 A | * | 11/1998 | Osada et al. ................. | 425/116 |
| 6,081,978 A | * | 7/2000 | Utsumi et al. ............. | 29/25.01 |
| 6,344,162 B1 | * | 2/2002 | Miyajima ............... | 264/272.14 |
| 2002/0030258 A1 | | 3/2002 | Fukasawa et al. .......... | 257/678 |

FOREIGN PATENT DOCUMENTS

| | | | |
|---|---|---|---|
| JP | 3-73454 | 7/1991 | .......... H01L/21/68 |
| JP | 11-026642 | 1/1994 | .......... H01L/23/28 |
| JP | 9-219421 | 8/1997 | .......... H01L/21/60 |
| JP | 10-079362 | 3/1998 | ........ H01L/21/301 |
| JP | 10-125705 | 5/1998 | .......... H01L/21/56 |
| JP | 2000-21786 | 1/2000 | ........ H01L/21/205 |
| JP | 2000-349114 | 12/2000 | .......... H01L/21/60 |

* cited by examiner

Primary Examiner—Wael Fahmy
Assistant Examiner—Howard Weiss
(74) Attorney, Agent, or Firm—Junichi Mimura

(57) ABSTRACT

A sealing apparatus for sealing by resin a semiconductor wafer having semiconductor elements on its surface. The apparatus includes an upper mold and a lower mold having an area where the semiconductor wafer is mounted, the lower mold having an uneven surface in the area and a shock absorber under the lower mold.

34 Claims, 14 Drawing Sheets

METHOD FOR MANUFACTURING SEMICONDUCTOR DEVICE BY USING SEALING APPARATUS

CROSS-REFERENCE TO RELATED APPLICATION

This application claims the priority benefit of Japanese Patent Application No. 2001-089851, filed Mar. 27, 2001, the entire disclosure of which is incorporated herein by reference.

BACKGROUND OF THE INVENTION

1. Field of the Invention

This invention relates to a sealing apparatus for sealing a semiconductor wafer having a plurality of semiconductor elements on its surface with a resin, to a mold of the sealing apparatus, to a semiconductor wafer capable of the sealing apparatus, and to a method for manufacturing a semiconductor device by using the sealing apparatus.

2. Description of the Related Art

Recently, it has been required to shrink electric devices. To meet the requirement, it is also required to downsize a semiconductor device. As one of the solutions to satisfy these requirements, it has been proposed to form a semiconductor device having a chip size package (CSP) structure. The size of the semiconductor device having the CSP structure is almost the same as that of the semiconductor chip.

The method of forming the semiconductor device having the CSP includes a step for forming a plurality of semiconductor elements on a semiconductor wafer, a step for setting the semiconductor wafer in a mold, a step for sealing a surface of the semiconductor wafer on which the semiconductor elements are formed by a thermoset resin, a step for removing the semiconductor wafer sealed by the resin from the mold, a step for polishing the resin on the semiconductor wafer until electrodes formed on each of the circuit elements are exposed, and a step for dividing the semiconductor wafer into semiconductor devices having the CSP structure. If necessary, external terminals, such as soldering balls, may be formed on the exposed electrodes.

However, the mold in the related art includes a lower mold having a plane surface where the semiconductor wafer is mounted. In the step for setting the semiconductor wafer in the mold, the semiconductor wafer is placed on the plane surface of the lower mold. Therefore, in the following step (the sealing step), since large stress is applied to the semiconductor wafer, the semiconductor wafer may be damaged from the stress. Further, when the semiconductor wafer is removed from the mold, the semiconductor wafer may be cracked because the semiconductor wafer is adhered to the mold. The larger the diameter of a semiconductor becomes, the more conspicuous this problem becomes.

SUMMARY OF THE INVENTION

It is therefore an object of the invention to resolve the above-described problem and provide a sealing apparatus to reduce damage to the semiconductor wafer by reducing stress applied to the semiconductor wafer when the surface of the semiconductor wafer, is sealed by the resin after the semiconductor wafer is set in the mold.

It is a further object of the invention to provide a sealing apparatus to remove the semiconductor wafer from the mold smoothly by preventing the semiconductor wafer adhering to the mold.

The object is achieved by a sealing apparatus including shock absorbers under the lower mold to reduce stress applied to the semiconductor wafer.

Another object is achieved by a sealing apparatus including a lower mold having an uneven surface in an area where the semiconductor wafer is mounted.

The above and further objects and novel features of the invention will more fully appear from the following detailed description, appended claims and accompanying drawings.

DETAILED DESCRIPTION OF THE PREFERRED EMBODIMENTS

In an embodiment, some drawings are enlarged or shrank properly as a matter of convenience of the description of the invention.

Figure 1:
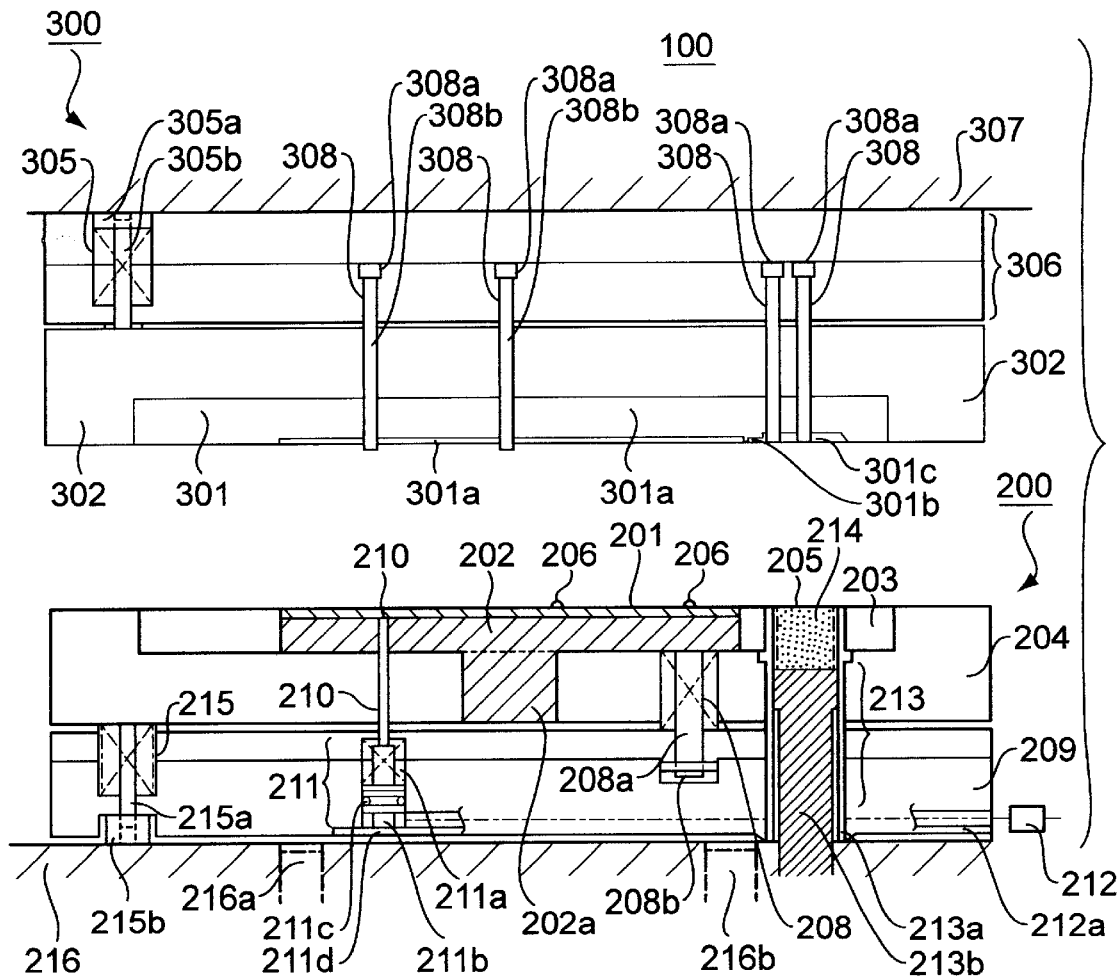
FIG. 1 is a cross-sectional view of a sealing apparatus in which a semiconductor wafer is set, according to a first embodiment of the invention.

Referring to FIG. 1, a sealing apparatus 100 for sealing a semiconductor wafer 201 with a resin 214 is illustrated. The sealing apparatus 100 includes a lower device 200 and an upper device 300. The lower device 200 includes a lower mold 202, which is explained later, and the upper device 300 includes an upper mold 301, which is also explained later. In general, although the upper and lower devices 200, 300 may be called upper and lower molds, in this embodiment, a part of the lower device 200 and a part of the upper device 300, which sandwich the semiconductor wafer directly, have been defined herein as the lower mold 202 and the upper mold 301, respectively.

Figure 2:
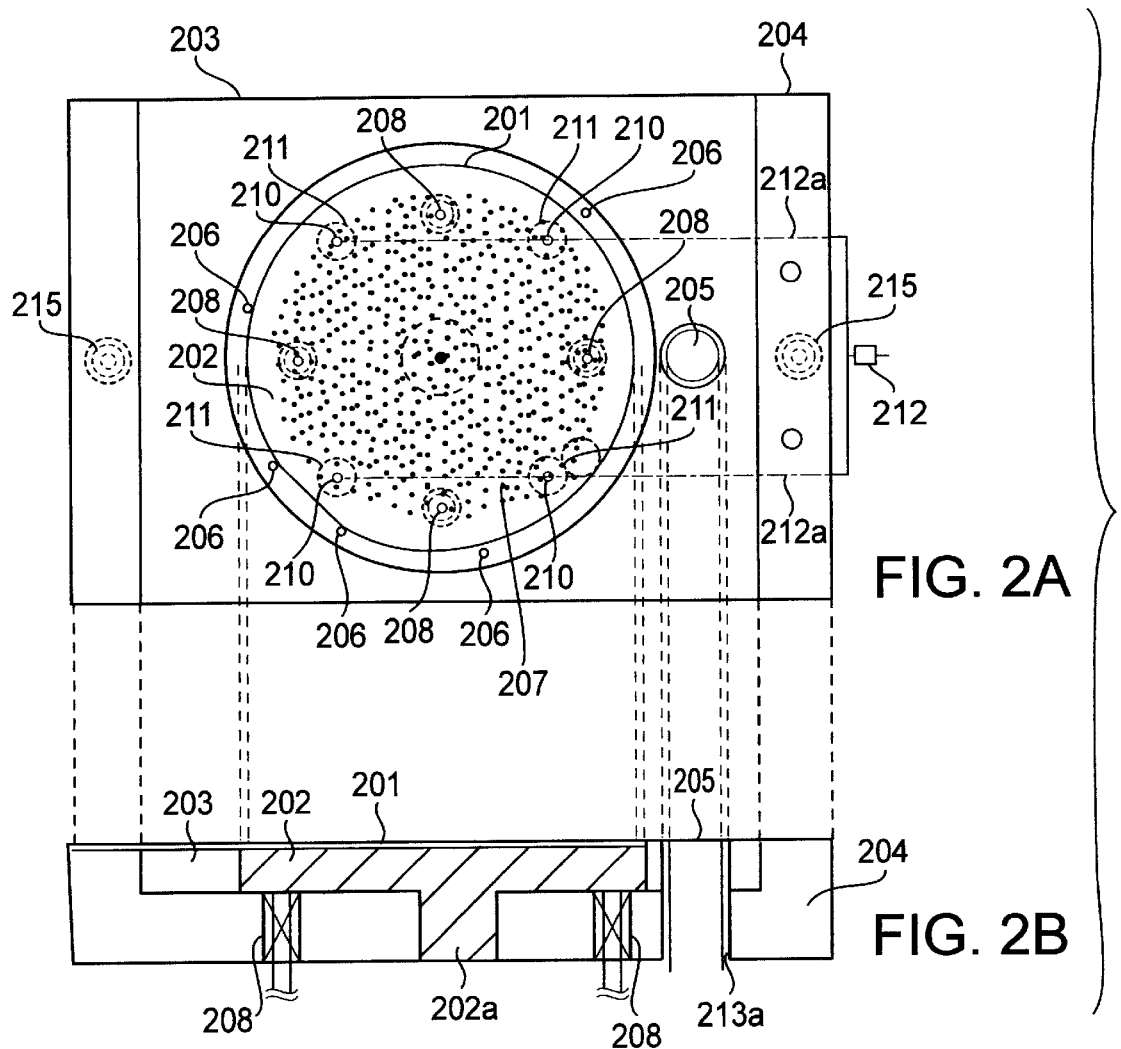
FIG. 2A is an upper view of a lower mold of the sealing apparatus shown in FIG. 1, with certain parts omitted.
FIG. 2B is a cross-sectional view of the lower mold shown in FIG. 2A.

First, the lower device 200 is explained with reference to FIG. 1 and FIGS. 2A and 2B. Referring to FIG. 1, the lower device 200 includes a first block 203 and a second block 204 in addition to the lower mold 202 on which the semiconductor wafer 201 having semiconductor elements on its surface is mounted. The first block 203 has a first recess at its center area, and the lower mold 202 is contained in the first recess. Thus, the first block 203 supports the lower mold 202 with an unillustrated component. Further, the second block 204 has a second recess at its center area, and the first block holding the lower mold 202 is contained in the second recess. Thus, the second block 204 supports the first block 203 and the lower mold 202. In FIG. 2, the circumference of the semiconductor wafer 201 is illustrated with a solid line so that a main surface of the lower mold 202, in an area in which the semiconductor wafer 201 is mounted can be seen.

In this embodiment, the lower mold 202, the first block 203, and the second block 204 are formed of the same material. In a process for sealing the semiconductor wafer 201 with a resin, which is explained later, the sealing apparatus 100 is subjected to a high temperature atmosphere in a range of 170–180 degrees centigrade. Thus, the lower mold 202, the first block 203, and the second block 204, but also other components of the sealing apparatus 100, are formed of the high heat-resistant metal material. Further, most of the components of the sealing apparatus 100 including the lower mold 202, the first block 203, and the second block 204 are made from the same kind of the high heat-resistant metal material. If the components of the sealing apparatus 100 were to be formed from respective different kinds of the high heat-resistant metal material, some of the components might be distorted because of the differences of coefficient of expansion between the high heat-resistant metal materials. Thus, if the same kind of metal material is used to form the components of the sealing apparatus 100, it is possible to avoid the distortion of the sealing apparatus 100. Specifically, the distortion of the each component should be avoided and the sealing apparatus 100 keeps its balance horizontally in order to form a uniform resin layer on the semiconductor wafer 201 as explained later. Of course, it is possible to use materials other than metal to form the components of the sealing apparatus 100, provided that they have a high heat-resistant characteristic. Furthermore, it is possible to form the components of the sealing apparatus 100 by the different kinds of the high heat-resistant material if the coefficient of expansion of each material can be controlled completely. However, in this embodiment, based on cost and ease of design, the same kind of the high heat-resistant metal material is used to form the components of the sealing apparatus 100. In the following description, it is considered that the components of the sealing apparatus 100 are formed of the same material as are used in the lower mold 202, the first block 203, and the second block 204 unless described otherwise.

A projection part 202a is formed underneath the center of the lower mold 202. Since the projection part 202a goes through the second block 204, one end of the projection part 202a reaches to a back surface of the lower mold 202 and the other end is exposed from a back surface of the second block 204. The projection part 202a is formed in order to keep the balance of the lower mold 202 in a primary horizontal direction. Thus, stability of the lower mold 202 in the horizontal direction is improved by arranging the projection part 202a. In this embodiment, the single projection part 202a is formed underneath the center of the lower mold 202. However, three or four projection parts may be formed underneath the lower mold 202. When three projection parts are formed, it is preferable that a distance from the center of the lower mold (a center 202C of the area where the semiconductor wafer 201 is mounted) to each projection part 202a is the same, and each distance between the projection parts is also the same. When four projection parts are formed, it is preferable that each projection part is disposed symmetrically against the center of the lower mold 202. Therefore, a distance from the center of the lower mold 202 to each projection part is the same. The purpose of disposing three or four projection parts in the way described above is to keep the balance of the lower mold 202 horizontal.

The lower device 200 includes an opening 205, which is disposed adjacent to the lower mold 202. A resin supplier 213 (generally, known as a plunger), which supplies the resin 214 to the semiconductor wafer 201, is disposed in the opening 205. The opening 205 goes through the first through third blocks 203, 204, 209.

A plurality of support pins 206 are formed at the periphery of the area on the lower mold 202 where the semiconductor wafer 201 is mounted. Thus, the area where the semiconductor wafer 201 is mounted is defined by the support pins 206, and the support pins 206 prevent the semiconductor wafer 201 from shifting when the surface of the semiconductor wafer 201 is sealed by the resin. In this embodiment, the circle-shaped semiconductor wafer 201 having an orientation-flat is used. However, since the shape of the semiconductor wafer varies, the positions of the support pins may be changed properly according to the shape of the semiconductor wafer.

A part of the main surface of the lower mold 202 in the area in which the semiconductor wafer 201 is mounted is processed to form an uneven surface 207. By forming the uneven surface 207, it is possible to avoid adhering the semiconductor wafer 201 to the lower mold 202. Thus, the semiconductor wafer 201 can be removed from the lower mold 202 smoothly and surely. In other words, the uneven surface 207 is formed in order to separate the semiconductor wafer 201 from the lower mold 202 easily. Generally, the back surface of the semiconductor wafer 201 is polished by a back-grind method. Therefore, the back surface of the semiconductor wafer 201 is easily adhered to the lower mold 202, whose surface is planished like a mirror. Further, when the semiconductor wafer 201 is sandwiched by the upper and lower molds 202, 301 in the resin sealing process, a large pressure is applied to the semiconductor wafer 201, so the strength adhering the semiconductor wafer 201 to the lower mold 202 is further increased. Specifically, a force in the range between a few tons and a few decades of tons is applied to the sealing device 100. Thus, the force applied to the upper and lower molds 202, 301 becomes a few tons/cm$^2$. To reduce such strength adhering the semiconductor wafer 201 to the lower mold 202, the uneven surface 207 is formed in the area in which the semiconductor wafer 201 is mounted.

The uneven surface 207 is formed in a coarse surface condition, like a surface of sandpaper, by an electric discharging process. Thus, at the area in which the semiconductor wafer 201 is mounted, infinite and minute projections are formed. In other words, the surface 207 feels rough with the infinite and minute projections. The infinite and minute projections have roughness in a range between 8 μm and 12 μm.

It is preferable that the area of the uneven surface be smaller than the size of the area where the semiconductor wafer 201 is mounted. This is because the minute projections should not exist under the periphery of the semiconductor wafer 201. If the minute projections exist under the periphery of the semiconductor wafer 201, large force may be focused on the periphery of the semiconductor wafer 201. As described above, the force in the range between a few tons and a few decades of tons is applied to the sealing device 100. Thus, it is preferable to reduce the large force being applied partially on the semiconductor wafer 201, as much as possible.

Figure 3:
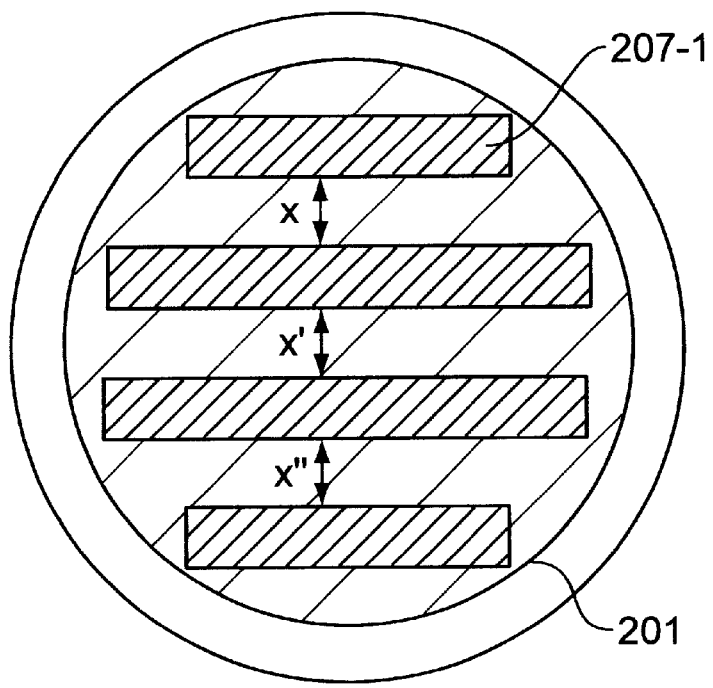
FIG. 3 shows a semiconductor wafer mounting area of the lower mold in a first alternative of the first embodiment of the invention.
Figure 4:
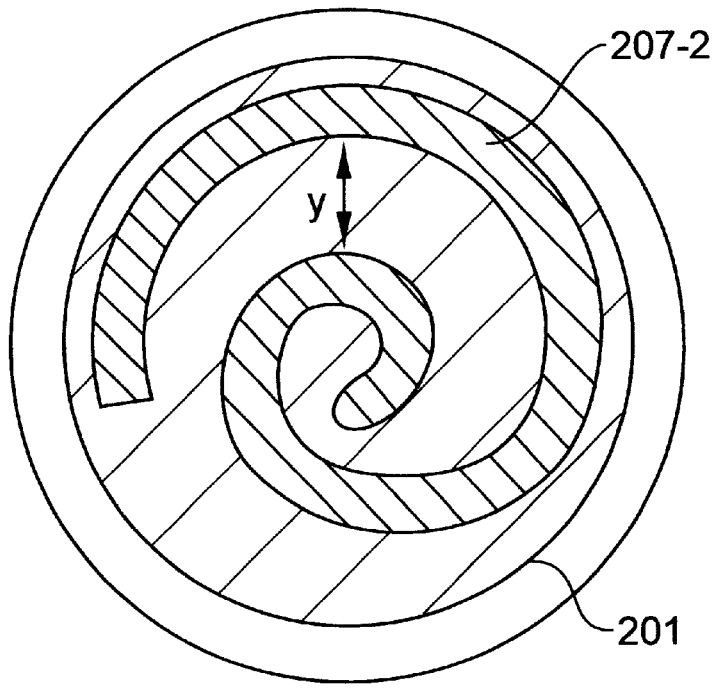
FIG. 4 shows a semiconductor wafer mounting area of the lower mold in a second alternative of the first embodiment of the invention.

As shown in FIG. 3, the uneven surface can be formed by slits 207-1. The slits 207-1 are formed in the area in which the semiconductor wafer 201 is mounted, and are placed in parallel to each other. Both ends of each slit should not be extended to the periphery of the area the semiconductor wafer 201 is mounted, for the reasons described above and because of prevention that the resin enters into the slits in a resin sealing process explained later. The width of each slit and the distances x, x', x" between slits may be determined by a designer. Thus, the width of each slit 207-1 may be different or may be the same, and the distances x, x', x" between slits may be different to may be the same. Further, as shown in FIG. 4, the uneven surface can be formed by a single spiral slit 207-2. In this alternative, the width of slit 207-2 and the distance y may be determined by the designer.

The lower device 200 further includes four first shock absorbers 208. The first shock absorbers 208 are formed under the lower mold 202 in order to absorb the impaling of the lower mold 202, in other words, to buffer the stress applied to the semiconductor wafer 201 when the semiconductor wafer 201 is sandwiched by the upper mold 301 and lower mold 202. In FIG. 2, the first shock absorbers 208 are disposed symmetrically against the center 202c of the area where the semiconductor wafer 201 is mounted. Therefore, a distance from the center 202c to each first shock absorber 208 is the same. Although the number of first shock absorbers 208 may be changed, it is preferable that each of the first shock absorbers, whatever the number, be disposed symmetrically against the center 202c. In FIG. 1, only one first shock absorber 208 is illustrated for the sake of simplicity. In addition to buffering stress applied to the semiconductor wafer 201 as described above, the first shock absorbers 208 serve to adapt to the varieties of the thickness of each of the semiconductor wafers.

The first shock absorbers 208, made of the same material as the lower mold 202, are metallic compression springs. As described above, since the sealing apparatus 100 is subjected to the high temperature in the range of 170–180 degrees centigrade, the high heat-resistant metallic compression springs are used for the first shock absorbers 208. Each of the first shock absorbers 208 includes a fixing member 208b and a bolt 208a. Each of the first shock absorbers 208 is fixed to the third block 209, which is a part of the sealing apparatus 100 and is formed under the second block 204, by the fixing member 208b. Further, as illustrated in FIG. 1, a gap between one end of the bolt 208a and the third block 209 is formed so that the bolt 208a can move a short distance up and down. The bolt 208a is also used for lifting up the lower mold 202 from the lower device 200. Of course, it is possible to form another element to lift the lower mold 202 up as an independent element.

The lower device 200 further includes four ejection pins 210, and four drivers 211 each of which operates to move one of the ejection pins 210 up or down. The drivers 211 are disposed symmetrically against the center 202c of the area where the semiconductor wafer 201 is mounted. Although the number of driver 211 may be changed, it is preferable that each of the drivers, whatever the number, be disposed symmetrically against the center 202c.

The ejection pins 210 are moved up by the drivers 211 when the semiconductor wafer 201 sealed by the resin is removed from the lower mold 202. The semiconductor wafer 201 is separated from the lower mold 202 by pushing with the ejection pins 210 from the back surface of the semiconductor wafer 201. Each of the ejection pins 210 passes through the second block 204 and the lower mold 202, and reaches to the top surface of the lower mold 202, on which the semiconductor wafer 201 is mounted. Therefore, there are four openings in the area of the lower mold 202 where the semiconductor wafer 201 is mounted, for the ejection pins 210. Thus, each ejection pin is stored in one of the openings. As well, although the number of ejection pins 210 may be changed in response to the number of drivers 211, it is preferable that each of the ejection pins, whatever the number, be disposed symmetrically against the center 202c.

Before the resin is introduced in the sealing apparatus 100, the drivers 211 make the ejection pins 210 move down in response to a solenoid valve 212 until the top portion of each ejection pins 210 is on the same plane of the top surface of the lower mold 202 or until the top of each ejection pins 210 is lower than the top surface of the lower mold 202. Thus, in the process by which the resin is introduced in the sealing apparatus 100, the top portion of each ejection pins 210 is located in the lower mold 202. After the process by which the resin is introduced in the sealing apparatus 100 has been completed, the ejection pins 210 are moved up by the operation of the drivers 211 until the top of each ejection pin 210 comes out from the top surface of the lower mold 202 during the process by which the sealed semiconductor wafer 201 is separated from the lower mold 202.

Each driver 211 includes a metallic compression spring 211a, a cylinder 211b, an O-ring 211c sealing the cylinder 211b, each of which is formed of the same material as the lower mold 202. Each driver 211 is fixed to the third block 209 by a fixing member 211d. In each driver 211, the operation of the cylinder 211b is controlled by air supplied from the solenoid valve 212 through a control tube 212a, and the stretch of the metallic compression spring 211a is controlled by the operation of the cylinder 211b.

The resin supplier 213 includes a tube 213a, and a pushing rod 213b disposed in the tube 213a. The tube 213a is disposed in the opening 205 that goes through the first through third blocks 203, 204, 209. Thus, the tube 213a also goes through the first, second and third blocks 203, 204, 209. The pushing rod 213b moves up and down in the tube 213a. A resin 214 in tablet of epoxy is set on the pushing rod 213b. The resin 214 is melted in an atmosphere in a range of 170–180 degrees centigrade, and then the melted resin 214 spouts from the tube 213a by pushing with the pushing rod 213b.

The lower device 200 further includes two second shock absorbers 208. The second shock absorbers 215 are formed in the third block 209 in order to absorb the impaling of the lower mold 202 and the second block 204, in other words, to buffer the stress applied to the semiconductor wafer 201 when the semiconductor wafer 201 is sandwiched by the upper mold 301 and lower mold 202. In FIG. 2, the second shock absorbers 215 are disposed symmetrically against the center 202c of the area where the semiconductor wafer 201 is mounted. Therefore, a distance from the center 202c to each second shock absorber 215 is the same. Although the number of second shock absorbers 215 may be changed, it is preferable that each of the second shock absorbers 215, whatever the number, be disposed symmetrically against the center 202c. In FIG. 1, only one second shock absorber 215 is illustrated for the sake of simplicity. In addition to buffering stress applied to the semiconductor wafer 201 as described above, the second shock absorbers 215 serve to adapt to maintain the third block 209 in a fixed position.

The second shock absorbers 215 made of the same material as the lower mold 202 are metallic compression springs. Each of the second shock absorbers 215 includes a fixing member 215b and a bolt 215a. Each fixing member 215b fixes one of the second shock absorbers 215 to a lower foundation 216. Further, as illustrated in FIG. 1, a gap between one end of the bolt 215a and the lower foundation 216 is formed so that the bolt 215a move a short distance up and down.

The lower device 200 having the components described above is mounted on the lower foundation 216. The lower foundation 216 includes hoists 216a, 216b to lift the lower device 200 up and down.

Figures 5A, 5B:
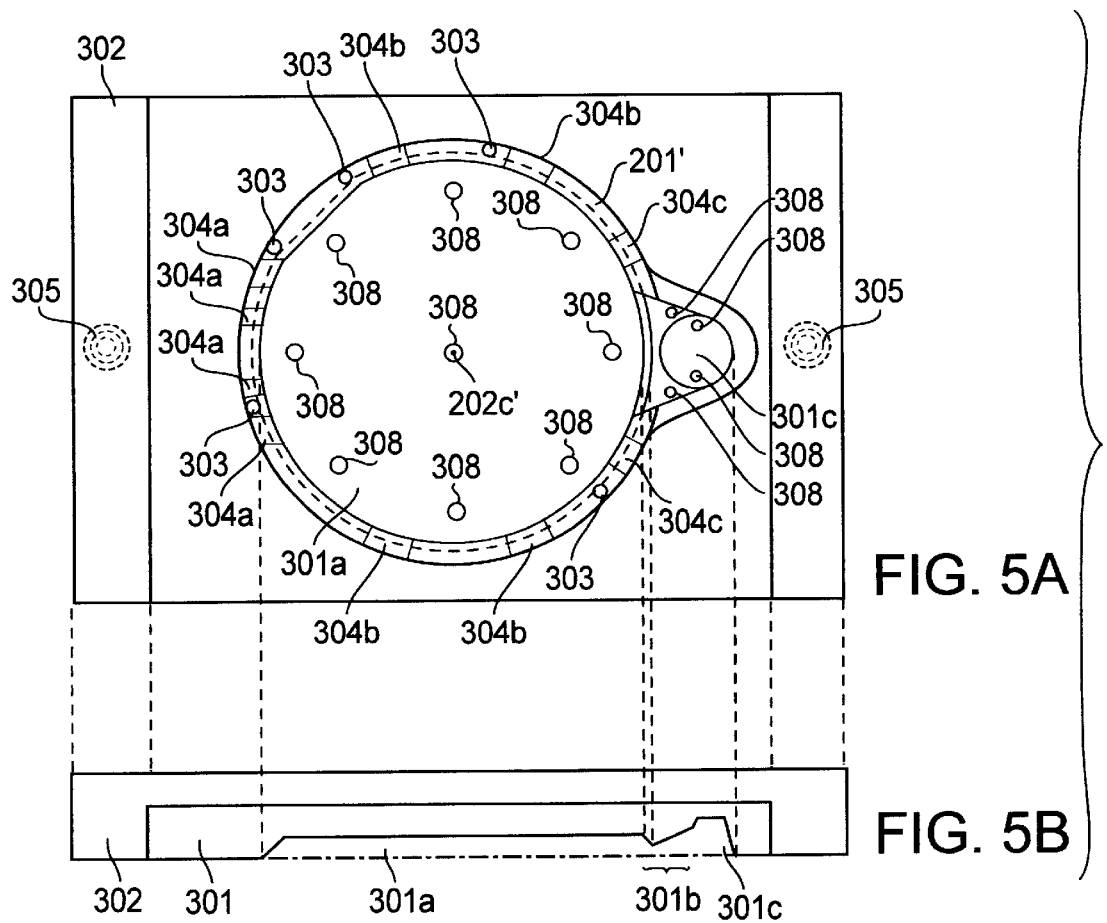
FIG. 5A is an upper view of an upper mold of the sealing apparatus shown in FIG. 1, with certain parts omitted.
FIG. 5B is a cross-sectional view of the upper mold shown in FIG. 5A.

Next, the upper device 300 is explained with reference to FIGS. 5A and 5B. The upper device 300 includes a first block 302 and a second block 306 in addition to the upper mold 301 for sandwiching a semiconductor wafer 201 with the lower mold 202. The first block 302 has a recess at its center, and the upper mold 301 is contained in the recess. The upper mold 301 includes a cavity 301 for entering the melted resin 214, which is supplied from the resin supplier 213, on the semiconductor wafer 201. As well as the parts of the lower device 200, the material of the upper mold 301 and the first block 302 is the same as that of the lower mold 202.

The upper mold 301 further includes a cull 301c, and a gate 301b that connects the cull 301c to the cavity 301a. The gate is located at a position corresponding to the periphery of the semiconductor wafer 201. When the melted resin 214 is introduced into and solidified in the cavity 301a after the semiconductor wafer 201 is sandwiched by the upper mold 301 and the lower mold 202, the thickness of the solidified resin 214 on the semiconductor wafer 202 should be thicker than that at the gate 301b, and the thickness of the solidified resin 214 in the cull 301 also should be thicker than that at the gate 301b.

As described above, the cavity 301a, the gate 301b, and the cull 301c are connected to each other. Thus, the upper mold 301 includes a recess consisting of the cavity 301a, the gate 301b, and the cull 301c. The recess acts as a resin passage. The gate 301b is formed in a fan shape. In other words, the gate 301b is tapered toward the cull 301c. Thus, the width of the gate 301b is expanding toward the cavity 301a. According to the shape of the gate 301c, the melted resin 214 runs into the cavity 301a easily.

The upper mold further includes holes 303 corresponding to the support pin 206 formed on the lower mold 202. When the semiconductor wafer 201 is sandwiched by the upper and lower molds 202, 301, the support pins 206 fit in the holes 303 for stabilizing the semiconductor wafer 201 at the predetermined position. In FIG. 5a, a broken line 201' shows the periphery of the semiconductor wafer 201 to be set.

When the semiconductor wafer 201 is sandwiched by the upper and lower molds 202, 301, the periphery 201' of the semiconductor wafer 201 shown by the broken line 201 is covered by the upper mold 301. Thus, the periphery 201' of the semiconductor wafer 201 is not sealed by the resin in the resin sealing process. Thus, the semiconductor wafer 201 has an unsealed area at its periphery 201'. In this embodiment, the unsealed area is set at 3 mm from the periphery 201'. Although the size of the unsealed area can be changed by the designer's choice, it is preferable that the unsealed area be set within few mm from the periphery 201' of the semiconductor wafer 201.

The upper mold 301 further includes air vents 304a, which are located at a position opposite to the gate 301b. When the melted resin is introduced into the cavity 301a after the lower and upper molds 202, 301 are coupled, the air in the cavity 301a is pushed by the melted resin 214, then air is released from the air vents 304a. This is the reason why the air vents 403a are formed at the location farthest from the gate 301b. Thus, it is possible to introduce the melted resin 214 into the cavity 301a smoothly because of effect of the air vents 304a. In this embodiment, although four air vents 304a are formed in the upper mold 301, first additional air vents 304b at a location between the gate 301b and the four air vents, and second additional air vents 304c adjacent to the gate 301b may be formed in addition to the four air vents. The melted resin can be expanded on the semiconductor wafer smoothly because of the air bent effect and the fan-shaped gate effect. The size and number of air vents can be selected by the designer. However, it is preferable that the sizes or number of air vents 304a, which are farthest from the gate 301c, be larger than other additional air vents 304b, 304c to release the air effectively.

The second block 306 includes drivers 305. The first block 302 and the upper mold 301 are coupled to the second block by the drivers 305. The second block 306 is fixed on an upper foundation 307. The upper device 300 further includes a plurality of ejection pins 308, each of which is moved up and down by the drivers 305. In FIG. 5A, an arrangement of the ejection pins 308 are illustrated. That is, eight ejection pins 308 are located above the cavity 301a, two ejection pins 308 are located above the gate 301b and two ejection pins are located above the cull 301c. As shown in FIG. 5A, two drivers 305 are formed in this embodiment. The drivers 305 are arranged symmetrically against a center 202c', which is located right above the center 202c of the area where the semiconductor wafer 201 is mounted. Although the number of drivers may be increased, it is preferable that the drivers, whatever the number, be arranged symmetrically against a center 202c'.

The ejection pins 308 are moved down when the resin 214 solidified in the cavity 301a, the gate 301b and the cull 301c is detached from the upper mold 301.

One end of each ejection pin 308 is fixed to the second block 306 by the fixing member 308a. Holes 308b, which go through the first block 302 and the upper mold 301, are formed, and each ejection pin is arranged in one of holds 308b.

In the process by which the resin 214 is introduces into the cavity 301a, the other end of each ejection pin 308 is located at the same surface of the resin passage (the cavity 301a, the gate 301b, the cull 301c) or is retracted from the surface of the resin passage by moving the first block 302 down by the drivers 305. In the process by which the resin sealed semiconductor wafer 201 is separated from the sealing apparatus 100, the other end of each ejection pin 308 is projected from the surface of the resin passage by moving the first block 302 up by the drivers 305.

As well as the other components, the drivers 305 are formed by the compression springs, and formed of the same material of the lower mold 202. The upper device 300 is fixed to the upper foundation 307, which is not moveable. On the other hand, as described above, the lower device 200 is fixed to the lower foundation 216, which is moveable by the hoists 216a, 216b. Thus, comparing to the hoists 216a, 215b, the large power is not required to the drivers 305.

Next, the operation of the sealing apparatus 100 is explained below with reference to several drawings. As shown in FIG. 1, the semiconductor wafer 201 is mounted on the uneven surface 207 of the lower mold 202 while the upper and lower devices 200, 300 are separated to each other. Then, the resin tablet 214 is placed in the tube 213a of the resin supplier 213. Under this condition, the upper and lower devices 200, 300 are heated by an unillustrated heater to reach a particular temperature at which the resin table is melted. Generally, since epoxy that is the material of the resin tablet 214 is melted at 170–180 degree centigrade, the upper and lower devices 200, 300 are heated to 170–180 degree centigrade. Under this condition, the resin table 214 is melted.

The ejection pins 210 are stored in the lower mold 202. The ejection pins 308 are located at the arbitrary position. In FIG. 1, the ejection pins 308 are projected from the surface of the resin passage.

Figure 6:
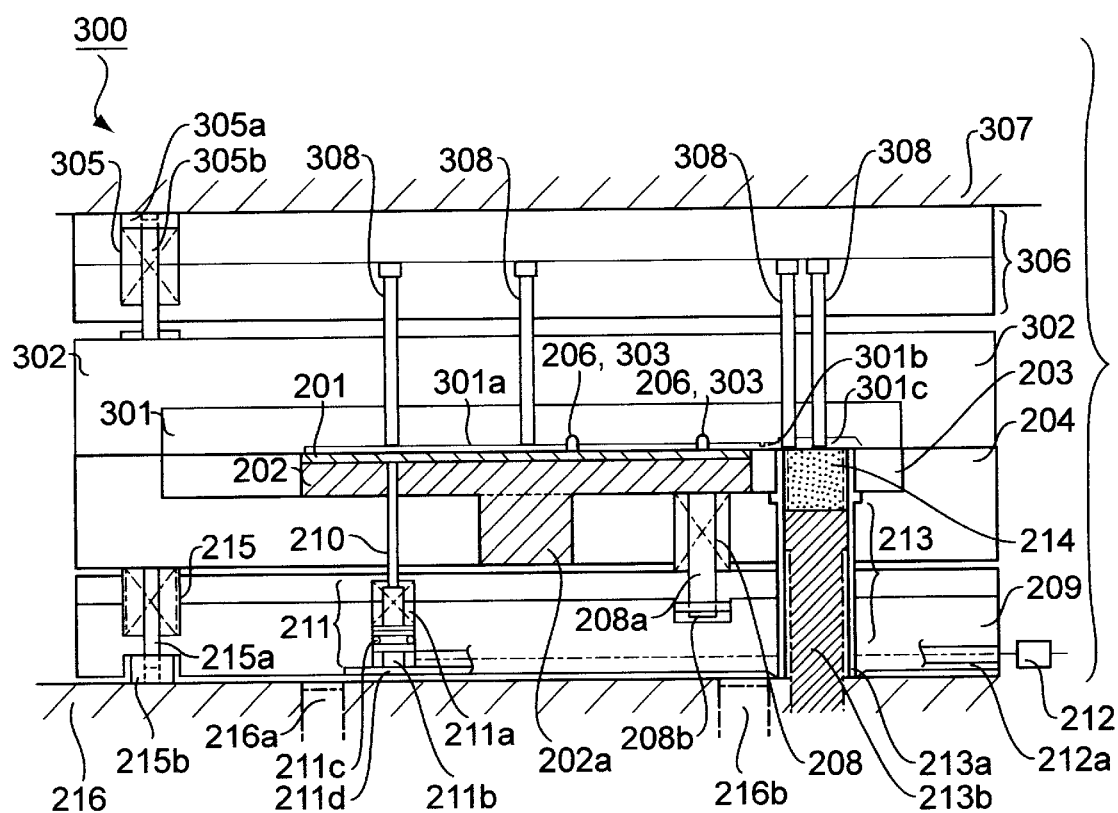
FIG. 6 is a cross-sectional view of the sealing apparatus of FIG. 1 in a process by which the semiconductor wafer is set in the upper and lower molds.

Next, as shown in FIG. 6, the upper and lower devices 200, 300 are coupled to each other by moving the lower device 200 up by the hoists 216a, 216b. Thus, the semiconductor wafer 201 is sandwiched at its periphery by the upper mold 301 and the lower mold 202. The resin passage consisting of the cavity 301a, the gate 301b and the cull 301c is established under this condition. Further, the support pins 206 are coupled to the holes 303. Moreover, the other end of each ejection pin 308 is located at the same surface of the resin passage or is retracted from the surface of the resin passage by moving the first block 302 down by the drivers 305. In other words, the other end of each ejection pin 308 is retreated into the upper mold 301.

In the process by which the upper and lower devices 200, 300 are coupled, when the semiconductor wafer 201 on the lower mold 202 contacts to the upper mold 301, the stress applied to the semiconductor wafer 201 is buffered by the first shock absorbers 208. That is, when the semiconductor wafer 201 on the lower mold 202 pressed against the upper mold 301, the spring of the first shock absorbers 208 is compressed so that the stress applied to the semiconductor wafer 201 is reduced. Simultaneously, the second shock absorbers 215 also serve to adopt to reduce the stress applied to the semiconductor wafer 201.

In the process by which the upper and lower devices 200, 300 are coupled, the reason why the lower device 200 moves up toward the fixed upper device 300 is explained as follows. The weight of each devices 200, 300 are hundreds kg. Thus, the large power is required to the hoists 216a, 216b to operate the lower device 200 so that the hoists 216a, 216b itself is getting larger. Forming the large size hoists 216a, 216b in the upper device 300 is not so easy, and influences the cost. Further, in the sealing device that the horizontal balance is highly required, forming the large and heavy hoists 216a, 216b in the upper device 300 may influence maintenance of the horizontal balance of the total sealing apparatus 100. It causes the difficulty to design the sealing apparatus 100. Accordingly, in this embodiment, the large and heavy hoists 216a, 216b is formed only in the lower device 202, and the upper device is fixed to the non-moveable upper foundation 307. Since the large and heavy hoists 216a, 216b are only formed in the lower device, the center of gravity of the sealing apparatus 100 is at low. Thus, it is easy to maintain the horizontal balance of the total sealing apparatus 100, and to design the total sealing apparatus 100. This reflects the cost.

Figure 7:
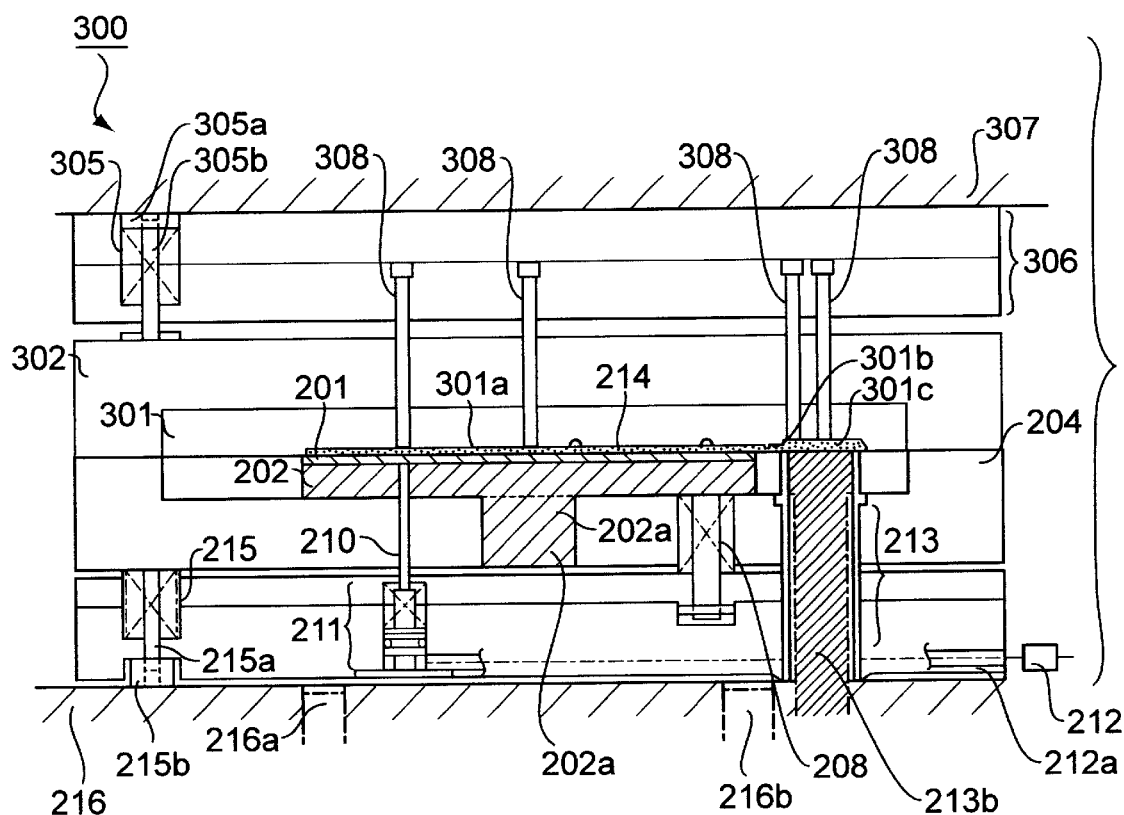
FIG. 7 is a cross-sectional view of the sealing apparatus of FIG. 1 in a process by which the surface of the semiconductor wafer is sealed by the resin.

Then, as shown in FIG. 7, the melted resin 214 is pushed out from the resin supplier 213 by moving the rod 213b up. Initially, the melted resin flows into the cull 301c. Then, the melted resin 214, which is further pushed by the rod 213b, flows into the cavity 301a, that is, on the semiconductor wafer 201, through the gate 301b. In this process, air in the cavity 301a is released from the air vents 304a, 304b, 304c. After the cavity 301a, the gate 301b, and the cull 301c are filled with the melted resin 214, the rod 213b puts pressure on the melted resin until the melted resin 214 is solidified. Generally, since the melted resin is solidified within 100 seconds under this condition, the pressure is applied to the resin for at least 100 seconds in this embodiment.

By the process described above, the surface of the semiconductor wafer 201 is sealed by the resin 214 solidified. However, as described above, since the periphery of the semiconductor wafer 201 is covered by the upper mold 301, the resin 214 is not formed on the periphery of the semiconductor wafer 201. The process is called the resin sealing process in this embodiment.

Figure 8:
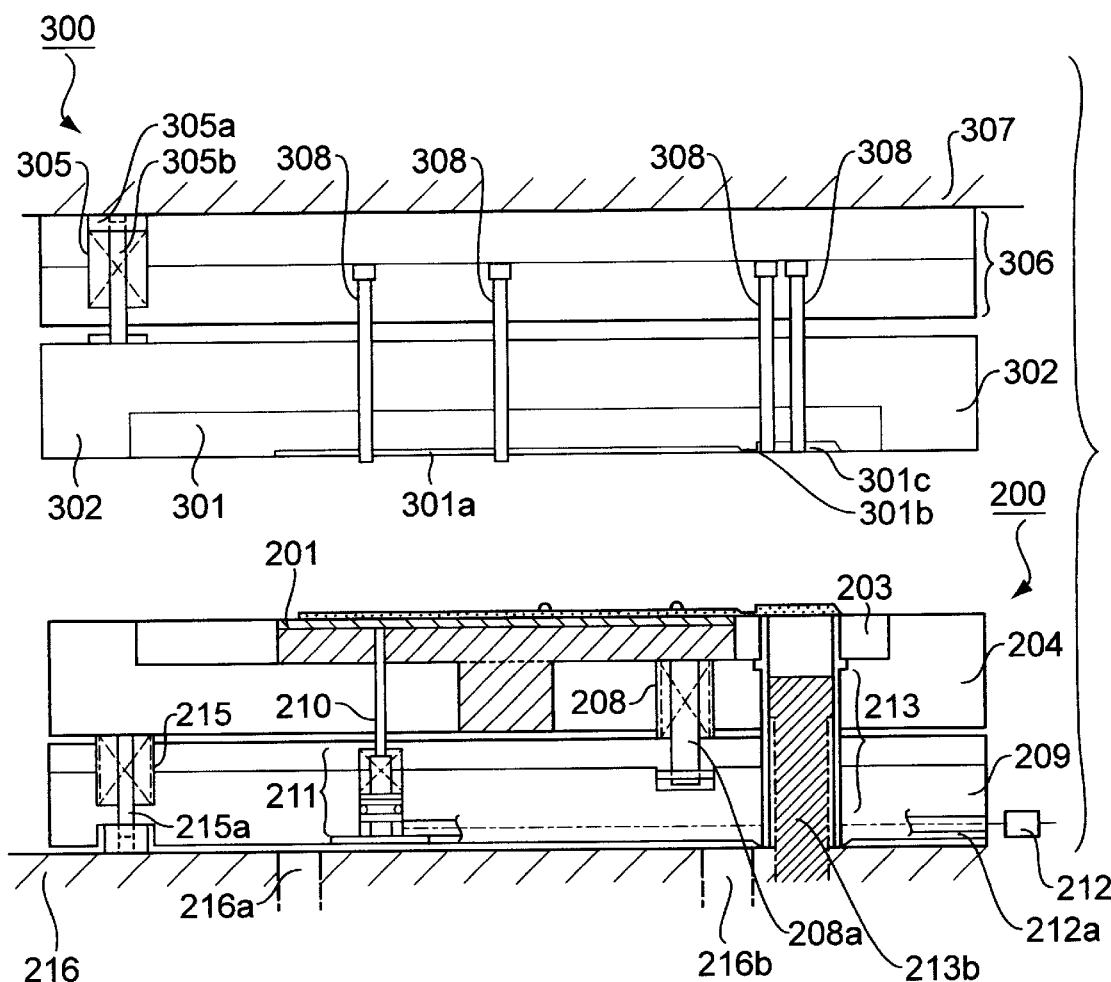
FIG. 8 is a cross-sectional view of the sealing apparatus of FIG. 1 in a process by which an upper device is separated from a lower device.

After that, as shown in FIG. 8, the lower device 200 is moved down by the operation of the hoists 216a, 216b. Thus, the semiconductor wafer 201 is released from the condition that the semiconductor wafer 201 is sandwiched by the upper and lower molds 202, 301. In this process, while the lower device 200 is moved down, the first block 302 of the upper device 300 is moved up by the operation of the drivers 305 so that the other end of the ejection pins 308 are projected from the surface of the resin passage. In other words, the other end of the ejection pins 308 are projected into the cavity 301a, the gate 301b and the cull 301c in this process. According to this movement, the solidified resin in the cavity 301a, the gate 301b and the cull 301c are pushed by the ejection pins 308, and are separated from the upper mold 301. While the lower device 200 is moved down, the rod 213b of the resin supplier 213 is moved down to be the initial position.

Figure 9A:
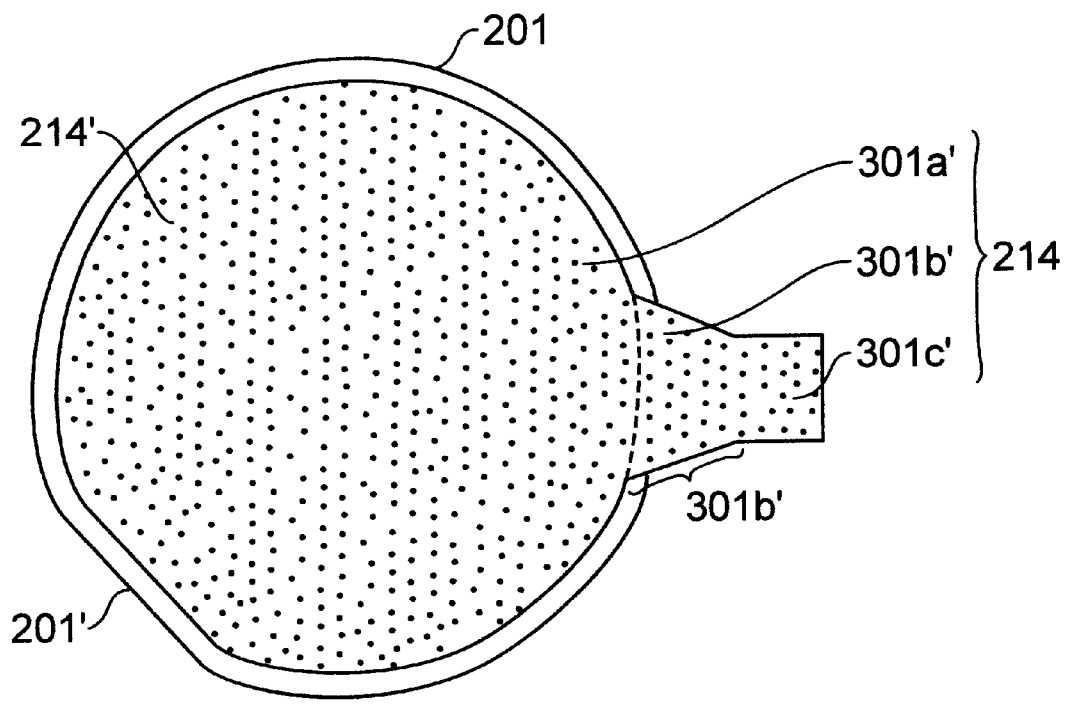
FIG. 9A shows an upper view of a solidified resin on the semiconductor wafer and at a gate formed by the upper and lower molds, with certain parts omitted.
Figure 9B:
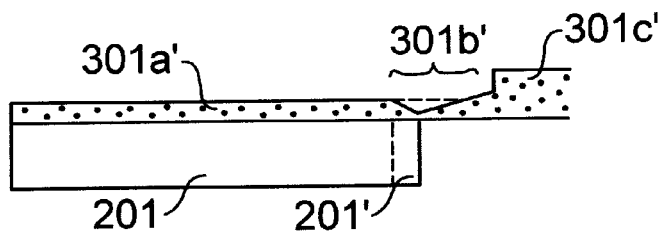
FIG. 9B shows a cross sectional view of the solidified resin shown in FIG. 9B.

Referring to FIGS. 9A and 9B, a first part 301a′ of the solidified resin 214, a second part 301b′ of the solidified resin 214 and a third part 301c′ of the solidified resin 214 are illustrated. The first part 301a′ was formed in the cavity 301a, and the second part 301b′ was formed in the gate 301. The third part 301c′ was formed in the cull 301c. As shown in the FIG. 9B clearly and described above, the first part 301a′ was formed thicker than the second part 301b′, and the third part 301c′ was formed thicker than the second part 301b′.

As described above, since the gate 301b is formed in fan shape, the shape of the second part 301b' at the gate is also fan-shaped. Since the periphery 201' of the semiconductor wafer 201 was covered by the upper mold 301 in the resin sealing process as described, no resin is formed there.

Figure 10:
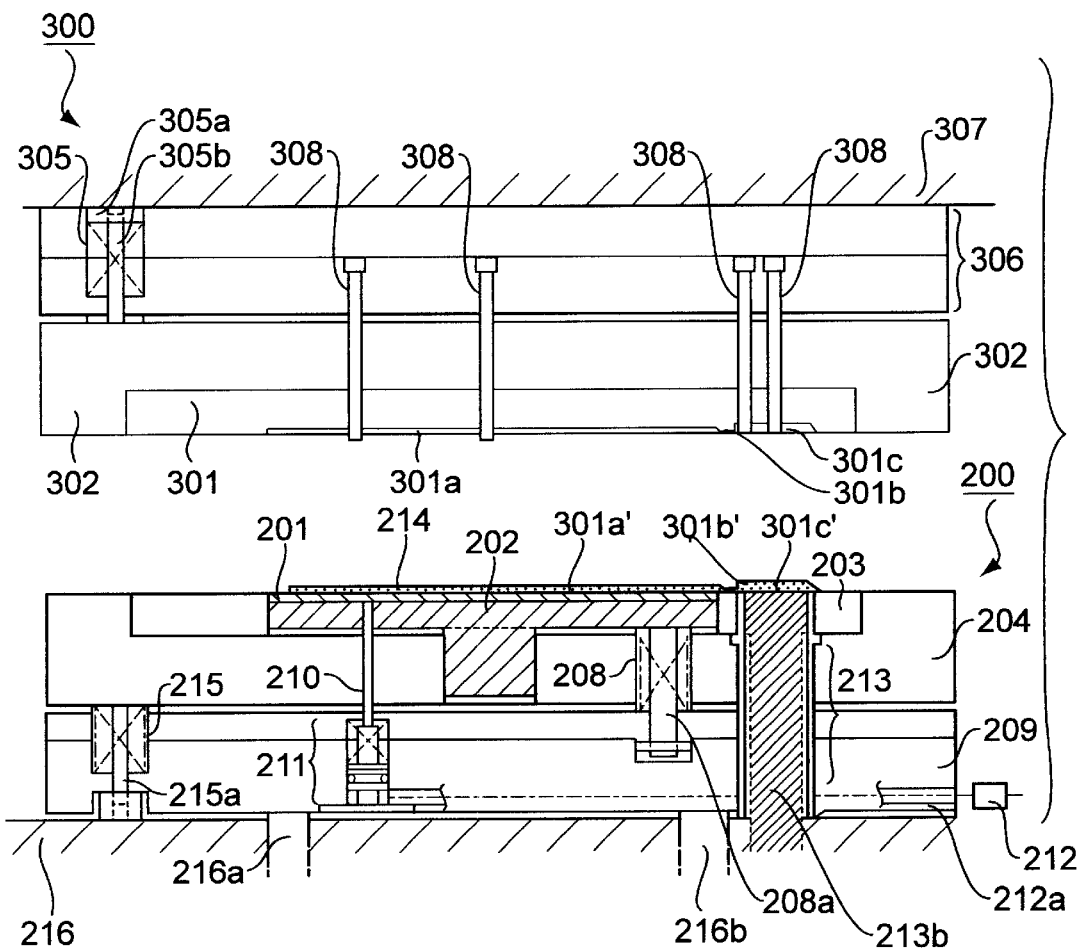
FIG. 10 is a cross sectional view of the sealing apparatus of FIG. 1 in a process by which the lower mold is separated from the first and second blocks.

After that, as shown in FIG. 10, the lower device 200 is further moved down by the operation of the hoists 216a, 216b. When the lower device 200 reaches to a predetermined position, namely, when one end of the bolt 215a of the second shock absorber 215 reaches to the lower foundation, the first and second block 203, 204 cannot move down anymore. Simultaneously, when one end of the bolt 208a of the first shock absorber 208 reaches to the third block 209, the lower mold 202 cannot move down anymore. When the operation for moving the lower device 200 down further continues, the lower mold 202 is pushed up, and then, the lower mold 202 is separated from first and second blocks 203, 204. Simultaneously, the rod 213b of the resin supplier 213 is moved up in order to push up the third part 301c' and the second part 301b' of the solidified resin 214. The moving-up operation of the rod 213b is synchronized with the moving-up operation of the lower mold 202. Thus, while the bolt 208a starts to move the lower mold 202 up, the rod 213b starts to move the third part 301c' and the second part 301b' of the solidified resin 214 up. The timing of the moving-up operation of the lower mold 202 and the moving-up operation of the rod 213b is controlled by an unillustrated controller formed in the lower foundation 216.

The details why the moving-up operation of the rod 213b is synchronized with the moving-up operation of the lower mold 202 are explained below with reference to FIGS. 11A, 11B.

Figure 11A:
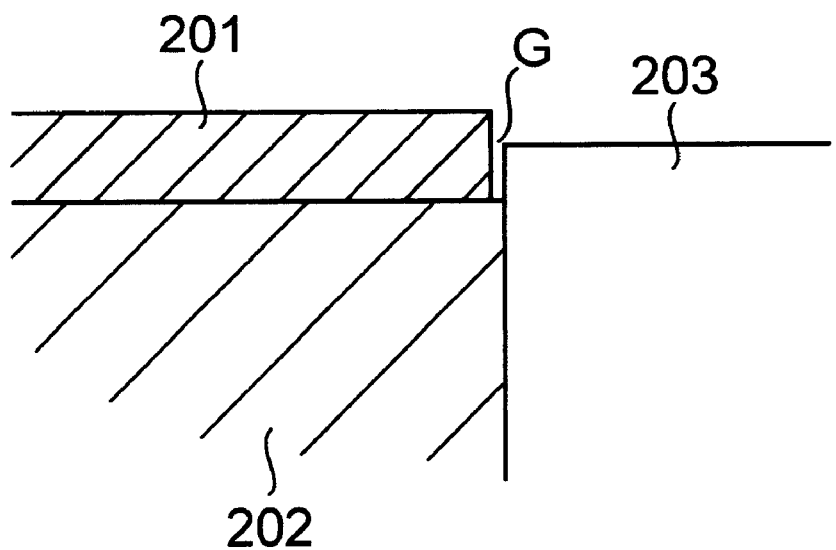
FIG. 11A is an enlarged partial cross sectional view at the gate before the sealing process is performed.
Figure 11B:
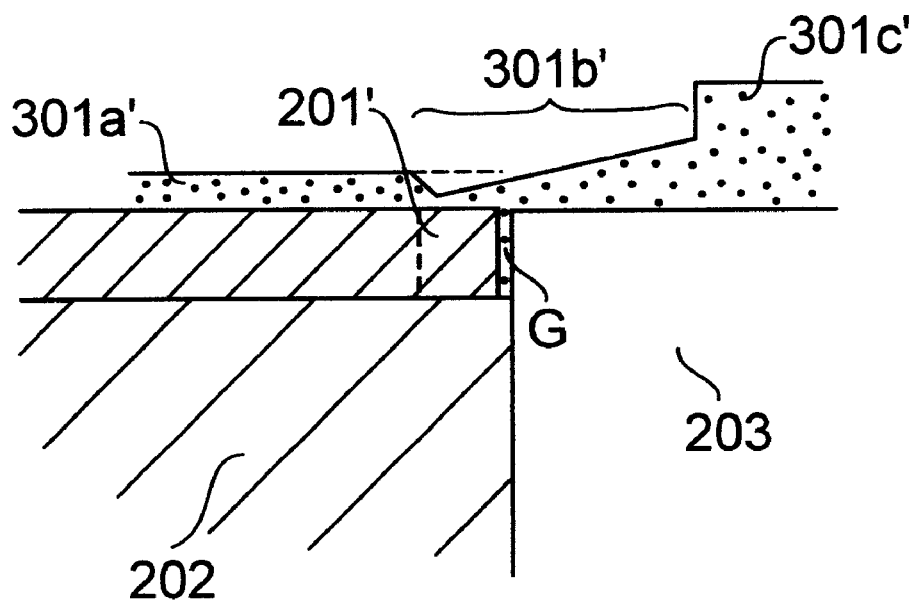
FIG. 11B is an enlarged partial cross sectional view at the gate after the sealing process is performed.

Referring to FIG. 11A, when the semiconductor wafer 201 is mounted on the lower mold 202, a gap G is formed between the semiconductor wafer 201 and the first block 203. When the semiconductor wafer 201 is sandwiched by the lower and upper molds 202, 301, the gap G connects to the gate 301b. In FIG. 11A, although there is a step difference between the main surface of the semiconductor wafer 201 and the upper surface of the first block 203, the step difference will be dissolved when the lower and upper molds 202, 301 are coupled. The downward stress, which occurs when the step difference is dissolved, and which is applied to the semiconductor wafer 201, is buffered by the first and second shock absorbers 208, 215.

Then, in the resin sealing process, when the melted resin 214 is introduced into the cavity 301a, the gate 301b and the cull 301c, the melted resin 214 is also enters into the gap G. Since the gap G encompasses the periphery 201' of the semiconductor wafer 201, the semiconductor wafer 201 is encompassed by the resin entered into the gap G just after the resin sealing process has been completed. Thus, in addition to the adhesion of the second part 301b' of the solidified resin 214 to the semiconductor wafer 201 and the first block 203, another adhesion between the semiconductor wafer 201 and the first block 203 by the resin 214 resides in the gap G. Specifically, this adhesion between the semiconductor wafer 201 and the first block 203 under the second part 301b' is stronger than that in another area.

When the semiconductor wafer 201 is separated from the lower mold 202 by moving up the lower mold 202 only, excessive stress may be applied to a part of the semiconductor wafer 201 close to the gate 301b by the adhesion. The excessive stress may warp or crack the semiconductor wafer 201. Accordingly, while the adhesion between the second and third parts 301b', 301c' of the solidified resin 214 and the first block 203 is destroyed mainly by moving the rod 213b up, the adhesion between the resin 214 entered in the gap G and the first block 203 is destroyed mainly by moving the lower mold 202 up. Since the moving-up operation of the rod 213b is synchronized with the moving-up operation of the lower mold 202, it is possible to avoid concentrating the stress caused by the adhesion of resin 214 at the periphery 201' of the semiconductor wafer 201.

Figure 12:
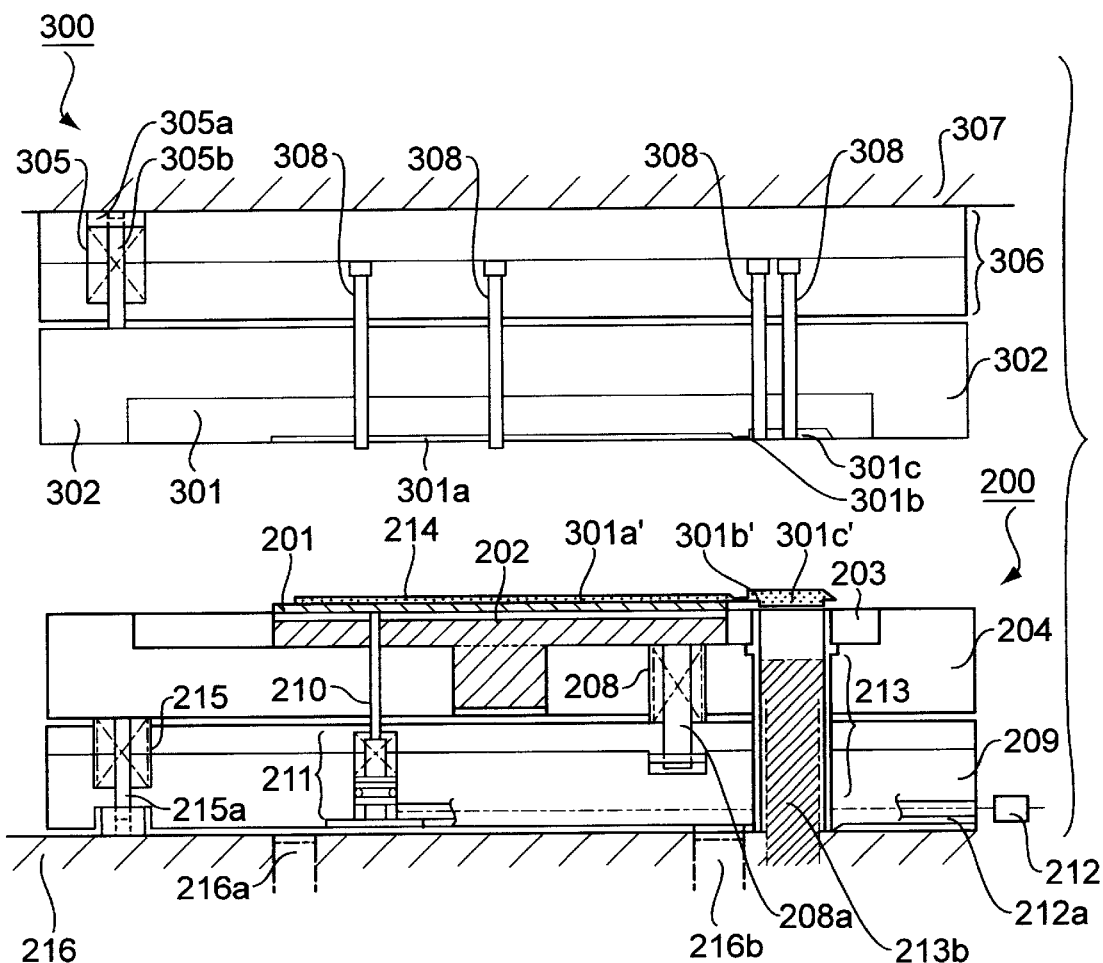
FIG. 12 is a cross-sectional view of the sealing apparatus of FIG. 1 in a process by which the semiconductor wafer is separated from the lower mold.
Figure 13:
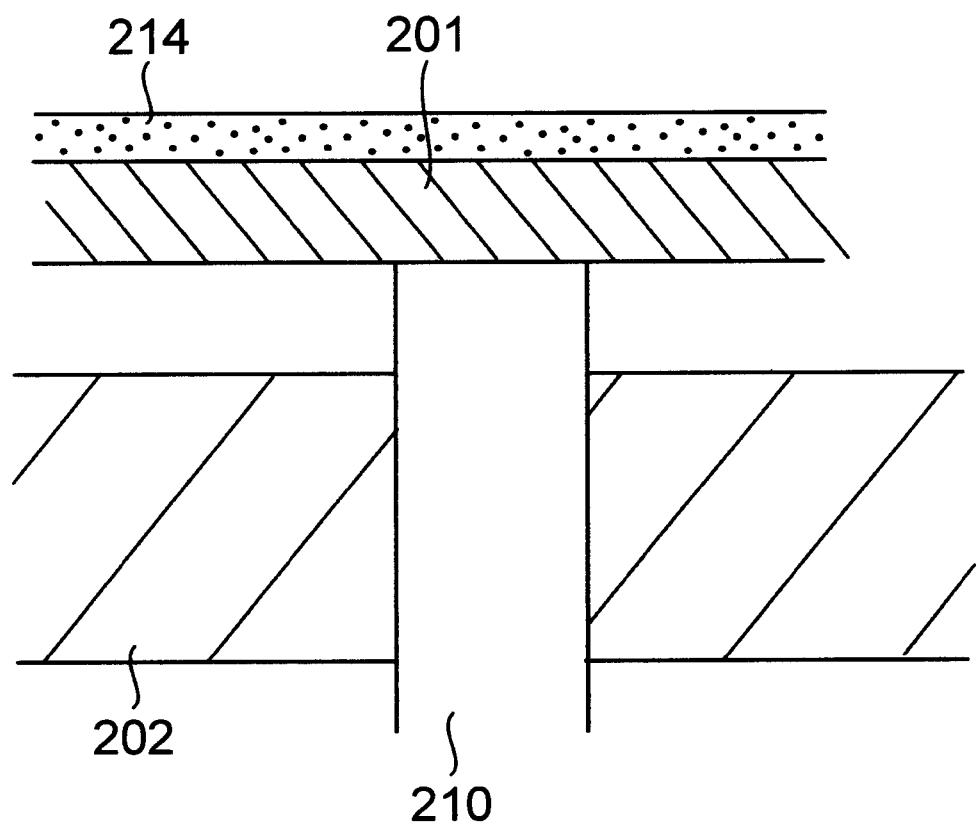
FIG. 13 is an enlarged partial cross sectional view showing the relationship between the ejection pin and the semiconductor wafer.

Referring to FIG. 12, after the lower mold 202 is separated from the first and second blocks 203, 204, the drivers 211 push the ejection pins 210 up in response to the solenoid valve 212. The ejection pins 210 are projected from the surface of the lower mold 202 so that the semiconductor wafer 201 is separated form the lower mold 202. Since the semiconductor wafer 201 was mounted on the uneven surface 207 of the lower mold 202, the semiconductor wafer 201 is not adhered to the lower mold 202 by compression of the upper mold 301. Thus, the semiconductor wafer 201 is separated form the lower mold 202 easily and smoothly by pushing its back surface by the ejection pins 210. Then, the lower device 200 returns to the initial position as shown in FIG. 1.

Simultaneously, the rod 213b moves down to the initial position. Thus, after the semiconductor wafer 201 was separated from the lower mold 202, the semiconductor wafer 201 and the solidified resin 214 are supported by the ejection pins 210 as shown in FIG. 12.

Figure 14A:
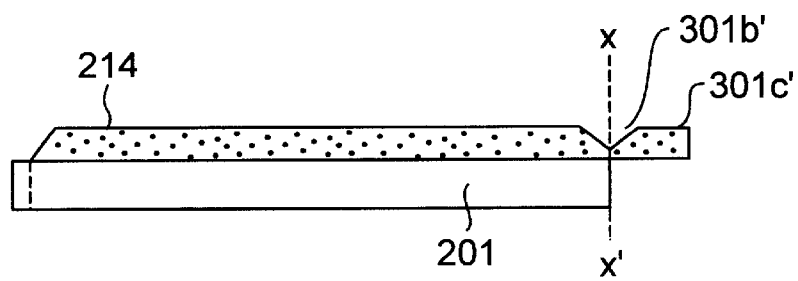
FIG. 14A is a cross-sectional view of the semiconductor wafer having a solidified resin.
Figure 14B:
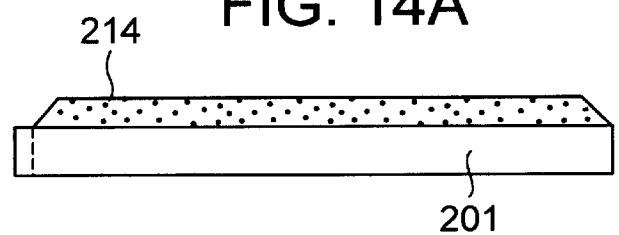
FIG. 14B is a cross-sectional view of the semiconductor wafer wherein a first part of the solidified resin is detached from second and third parts.

After that, referring to FIG. 14A, the semiconductor wafer 201, which was floated from the lower mold 202 by the ejection pins 210, is carried out from the sealing apparatus 100. Then, the solidified resin 214 is cut along the periphery of the semiconductor wafer 201 (along the line X–X') so that the first part 301a' of the solidified resin 214 is detached from the second and third parts 301b', 301c' of the solidified resin 214. As a result, the semiconductor wafer 201 whose main surface is sealed by the resin 214, is obtained as shown in FIG. 14B. In this detaching process, since the second part 301b' is thinner than the first and third parts 301a', 301c', it is easy to cut the solidified resin 214 at the gate 301b accurately. The detaching process is performed by applying physical pressure to the second part 301b'. Of course, the detaching process may be performed by using a cutter in order to shorten the processing time. When the cutter is used, it is possible to reduce the amount of dust, which may be occurred at the cutting process. If the gate 301b is formed above the semiconductor wafer 201 or is formed at the location away from the semiconductor wafer 201, it is clear that the above-described benefit can not be obtained. Further, some parts of the solidified resin 214 on the semiconductor wafer 201 may come off, or a part of the second part 301b' of the solidified resin 214 may reside. It should be avoided.

Figure 14C:
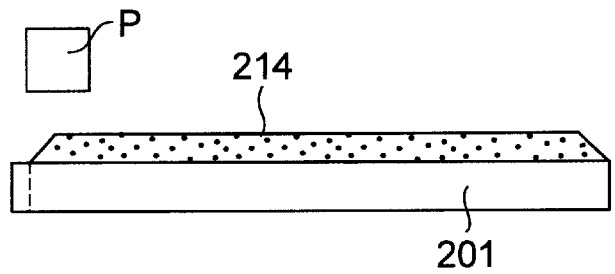
FIG. 14C is a cross-sectional view of the semiconductor wafer, which is polished on its surface.

Next, as shown in FIG. 14C, the surface of the solidified resin 214 is polished by a polishing machine P until electrodes, which are connected to the circuits formed in the semiconductor wafer 201, are exposed. In this polishing process, since the thickness of the solidified resin 214 should be uniformity, the above-described horizontal balance of the sealing device 100 is specifically important.

Figure 14D:
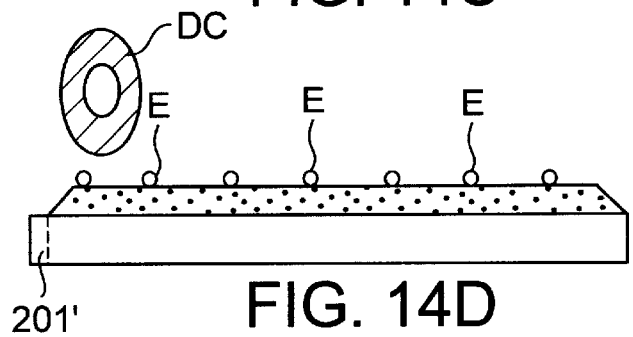
FIG. 14D is a cross-sectional view of the semiconductor wafer, which is diced.
Figure 14E:
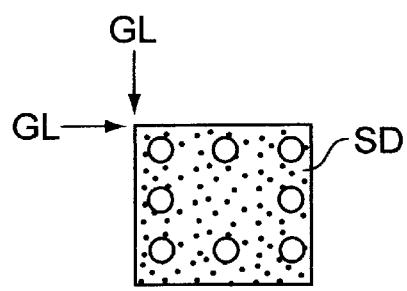
FIG. 14E is a plan view of the semiconductor device after being diced.

Next, as shown in FIG. 14D, external terminals E are formed on the exposed electrodes. In this embodiment, although ball-shaped external terminals E are illustrated, other-shaped external terminals such as a plane-shape external terminal may be formed. Then, the semiconductor wafer 201 is diced by a dicing cutter DC to make independent semiconductor devices SD. This process is called a dicing process. The diced independent semiconductor device SD, which is shown in FIG. 14E, is called a chip size package (CSP) structure semiconductor device. Thus, it is preferable to apply this embodiment to manufacture the CSP structure semiconductor device.

Figure 15:
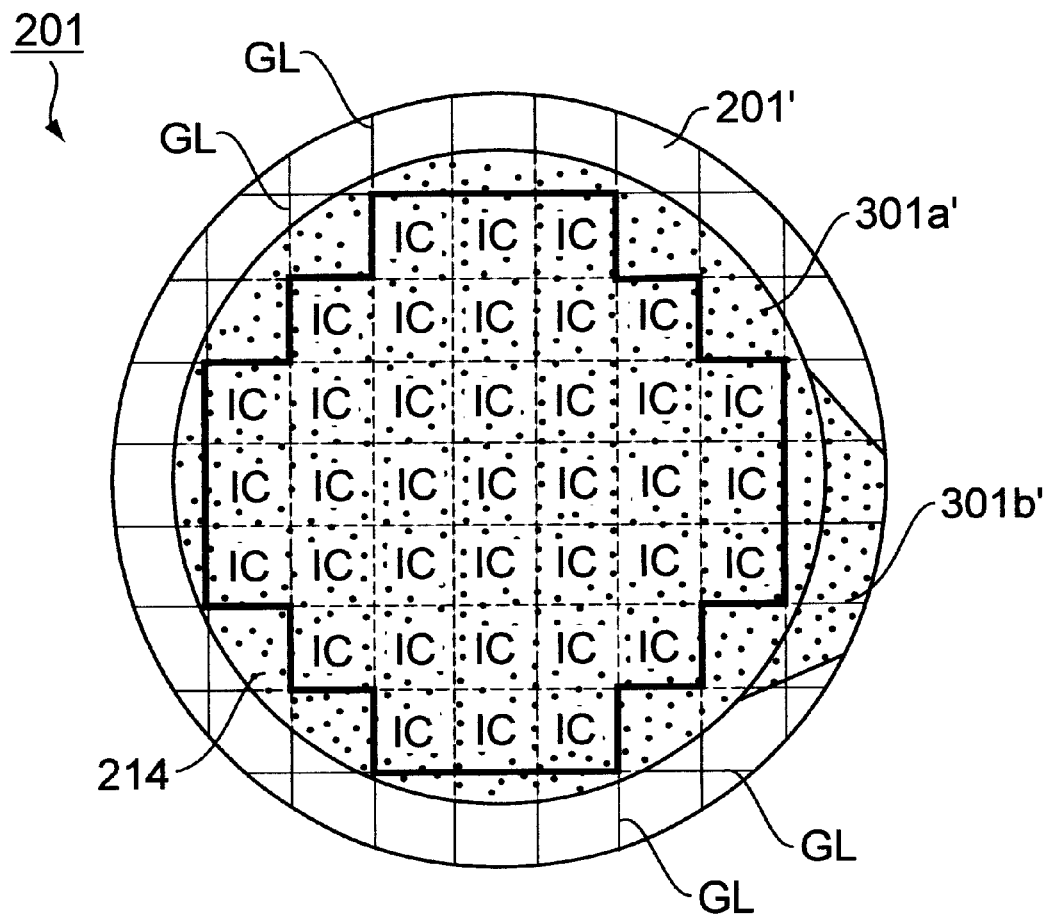
FIG. 15 is an upper view of the resin sealed semiconductor wafer.

If all main surface of the semiconductor wafer 201 is sealed by the resin 214, the dicing process would be difficult because grid lines, which are formed on the surface of the semiconductor wafer 201, are covered by the resin 214. However, as shown in FIG. 15, since the periphery 201' of the semiconductor wafer 201 is exposed in this embodiment, the grid line GL can be seen. Thus, the semiconductor wafer 201 is diced alone the grid line GL.

According to the embodiment, since the first and second shock absorbers 208, 215 are formed, the stress applied to the semiconductor wafer 201 in the resin sealing process can be buffered. Further, since the uneven surface 207 is formed on the lower mold 202, the semiconductor wafer 201 can be separated from the lower mold 202 easily and smoothly because the uneven surface 207 avoids adhering the semiconductor wafer 201 to the lower mold 202.

While the present invention has been described with reference to illustrative embodiments, this description is not intended to be construed in a limiting sense. Various other modifications of the illustrated embodiments, as well as other embodiments of the invention, will be apparent to those skilled in the art on reference to this description. Therefore, the appended claims are intended to cover any such modifications or embodiments as fall within the true scope of the invention.

What I claim is:

1. A method of manufacturing a semiconductor device, comprising:
    preparing a mold having a upper mold and a lower mold, the lower mold having an area where a the semiconductor wafer having a main surface and a back surface is mounted, the lower mold having an uneven surface in the area, and the upper mold having a resin passage for introducing a melted resin on the semiconductor wafer;
    placing the semiconductor wafer directly in the area of the lower mold wherein the back surface of the semiconductor wafer contacts the lower mold directly in the area;
    sandwiching the semiconductor wafer by the upper and lower molds;
    introducing the melted resin through the resin passage on the main surface of the semiconductor wafer whereby the main surface of the semiconductor wafer is sealed by the resin; and
    separating the resin sealed semiconductor wafer from the molds.

2. A method of manufacturing a semiconductor device as claimed in claim 1, wherein sandwiching the semiconductor wafer by the upper and lower molds is performed by moving up the lower mold on which the semiconductor wafer is mounted, in order to contact to the upper mold, which is not moveable.

3. A method of manufacturing a semiconductor device as claimed in claim 1, wherein separating the resin sealed semiconductor wafer from the molds includes separating the sealed semiconductor wafer from the upper mold by moving the lower mold down, and separating the sealed semiconductor wafer from the lower mold by pushing the sealed semiconductor wafer up.

4. A method of manufacturing a semiconductor device as claimed in claim 1, wherein the uneven surface is formed in a coarse condition by an electric discharging process.

5. A method of manufacturing a semiconductor device as claimed in claim 4, wherein the area is a first area, the coarse surface is formed within a second area, which is in the first area, and the coarse surface is not formed in the periphery of the first area.

6. A method of manufacturing a semiconductor device as claimed in claim 5, wherein the coarse surface has a roughness in a range between 8 $\mu$m and 12 $\mu$m.

7. A method of manufacturing a semiconductor device as claimed in claim 5, further including polishing the resin, which seals the semiconductor wafer, after the semiconductor wafer is separated from the mold.

8. A method of manufacturing a semiconductor device as claimed in claim 1, wherein when the semiconductor wafer is sandwiched by the upper and lower molds, the upper and lower molds sandwich the periphery of the semiconductor wafer in order not to seal the periphery of the semiconductor wafer by the resin while the melted resin is introduced on the semiconductor wafer.

9. A method of manufacturing a semiconductor device as claimed in claim 8, wherein the semiconductor wafer includes grid lines on its surface for identifying independent semiconductor devices so that parts of the grid lines are exposed after the resin sealed semiconductor wafer is separated from the molds.

10. A method of manufacturing a semiconductor device as claimed in claim 9, further comprising cutting the semiconductor wafer along the grid lines to form the independent semiconductor devices after the resin is polished.

11. A method of manufacturing a semiconductor device using a lower mold and an upper mold, comprising:
    introducing the melted resin on main surface of a semiconductor wafer while the semiconductor wafer is sandwiched by the upper and lower molds; and
    buffering stress caused by the lower mold and the upper mold and applied to the semiconductor wafer during introducing the melted resin on the main surface of a semiconductor wafer and during sandwiching the semiconductor wafer.

12. A method of manufacturing a semiconductor device as claimed in claim 11, wherein stress is buffered by at least one shock absorber, which is formed under the lower mold.

13. A method of manufacturing a semiconductor device, comprising:
    preparing a mold having a upper mold and a lower mold, the lower mold having an area where a the semiconductor wafer having a main surface and a back surface is mounted, the upper mold having a resin passage for introducing a melted resin on the semiconductor wafer;
    placing the semiconductor wafer in the molds;
    sandwiching the semiconductor wafer by the upper and lower molds;
    introducing the melted resin through the resin passage on the main surface of the semiconductor wafer while the semiconductor wafer is sandwiched by the upper and the lower molds, whereby the main surface of the semiconductor wafer is sealed by the resin;
    separating the sealed semiconductor wafer from the upper mold by moving the lower mold down; and
    separating the resin sealed semiconductor wafer from the lower mold.

14. A method of manufacturing a semiconductor device as claimed in claim 13, wherein sandwiching the semiconductor wafer by the upper and lower molds is performed by moving up the lower mold on which the semiconductor wafer is mounted, in order to contact to the upper mold, which is not moveable.

15. A method of manufacturing a semiconductor device as claimed in claim 14, wherein when the semiconductor wafer is sandwiched by the upper and lower molds, the upper and lower molds sandwich the periphery of the semiconductor wafer in order not to seal the periphery of the semiconductor wafer by the resin while the melted resin is introduced on the semiconductor wafer.

16. A method of manufacturing a semiconductor device as claimed in claim 15, wherein the semiconductor wafer includes grid lines on its surface for identifying independent semiconductor devices so that parts of the grid lines are exposed after the resin sealed semiconductor wafer is separated from the molds.

17. A method of manufacturing a semiconductor device as claimed in claim 16, further comprising polishing the resin, which seals the semiconductor wafer, after the semiconductor wafer is separated from the molds.

18. A method of manufacturing a semiconductor device as claimed in claim 17, further comprising cutting the semiconductor wafer along the grid lines to form the independent semiconductor devices after the resin is polished.

19. A method of manufacturing a semiconductor device as claimed in claim 13, wherein the sealed semiconductor wafer is separated from the lower mold by pushing the sealed semiconductor wafer up under the condition that the resin on the semiconductor wafer is connected to the other resin formed in a part of the resin passage.

20. A method of manufacturing a semiconductor device as claimed in claim 19, further comprising detaching the other resin formed in the part of the resin passage from the resin formed on the semiconductor wafer after the sealed semiconductor wafer is separated from the lower mold by pushing the sealed semiconductor wafer up.

21. A method of manufacturing a semiconductor device as claimed in claim 13, wherein when the semiconductor wafer is sandwiched by the upper and lower molds, the upper and lower molds sandwich the periphery of the semiconductor wafer in order not to seal the periphery of the semiconductor wafer by the resin while the melted resin is introduced on the semiconductor wafer.

22. A method of manufacturing a semiconductor device as claimed in claim 21, wherein the semiconductor wafer includes grid lines on its surface for identifying independent semiconductor devices so that parts of the grid lines are exposed after the resin sealed semiconductor wafer is separated from the molds.

23. A method of manufacturing a semiconductor device as claimed in claim 22, further comprising polishing the resin, which seals the semiconductor wafer, after the semiconductor wafer is separated from the molds.

24. A method of manufacturing a semiconductor device as claimed in claim 23, further comprising cutting the semiconductor wafer along the grid lines to form the independent semiconductor devices after the resin is polished.

25. A method of manufacturing a semiconductor device as claimed in claim 13, wherein the semiconductor wafer includes the back surface opposite to the main surface, and wherein the back surface of the semiconductor wafer is facing to the lower mold having an uneven surface when semiconductor wafer is placed in the molds.

26. A method of manufacturing a semiconductor device as claimed in claim 25, wherein the uneven surface is formed in a coarse condition by an electric discharging process.

27. A method of manufacturing a semiconductor device as claimed in claim 26, wherein the area is a first area, the coarse surface is formed within a second area, which is in the first area, and the coarse surface is not formed in the periphery of the first area.

28. A method of manufacturing a semiconductor device as claimed in claim 27, wherein the coarse surface has a roughness in a range between 8 $\mu$m and 12 $\mu$m.

29. A method of manufacturing a semiconductor device as claimed in claim 25, wherein the uneven surface is formed by slits.

30. A method of manufacturing a semiconductor device as claimed in claim 29, wherein the slits are formed in parallel to each other.

31. A method of manufacturing a semiconductor device as claimed in claim 25, wherein the uneven surface is formed by a single spiral slit.

32. A method of manufacturing a semiconductor device as claimed in claim 13, further including buffering stress caused by the lower mold and the upper mold and applied to the semiconductor wafer by at least one shock absorber during introducing the melted resin on the main surface of a semiconductor wafer and during sandwiching the semiconductor wafer.

33. A method of manufacturing a semiconductor device as claimed in claim 32, wherein the shock absorbers being disposed symmetrically against the center of the area.

34. A method of manufacturing a semiconductor device as claimed in claim 33, wherein each shock absorber is formed by a metallic compression spring.

* * * * *